(12) United States Patent
Selvamanickam

(10) Patent No.: US 11,309,480 B2
(45) Date of Patent: Apr. 19, 2022

(54) ULTRA-THIN FILM SUPERCONDUCTING TAPES

(71) Applicant: The University of Houston System, Houston, TX (US)

(72) Inventor: Venkat Selvamanickam, Houston, TX (US)

(73) Assignee: University of Houston System, Houston, TX (US)

( * ) Notice: Subject to any disclaimer, the term of this patent is extended or adjusted under 35 U.S.C. 154(b) by 615 days.

(21) Appl. No.: 15/573,632

(22) PCT Filed: May 11, 2016

(86) PCT No.: PCT/US2016/031838
§ 371 (c)(1),
(2) Date: Nov. 13, 2017

(87) PCT Pub. No.: WO2016/183190
PCT Pub. Date: Nov. 17, 2016

(65) Prior Publication Data
US 2018/0151792 A1  May 31, 2018

Related U.S. Application Data

(60) Provisional application No. 62/159,690, filed on May 11, 2015.

(51) Int. Cl.
*H01L 39/24* (2006.01)
*H01L 39/12* (2006.01)
*H01L 39/14* (2006.01)

(52) U.S. Cl.
CPC ......... *H01L 39/248* (2013.01); *H01L 39/126* (2013.01); *H01L 39/143* (2013.01); *H01L 39/2461* (2013.01); *H01L 39/2464* (2013.01)

(58) Field of Classification Search
CPC ................................................ H01L 39/12–24
See application file for complete search history.

(56) References Cited

U.S. PATENT DOCUMENTS

| | | | |
|---|---|---|---|
| 5,280,013 A | 1/1994 | Newman et al. | |
| 2004/0248743 A1 | 12/2004 | Norton et al. | |
| 2007/0179063 A1* | 8/2007 | Malozemoff | H01L 39/24 505/329 |
| 2009/0137399 A1 | 5/2009 | Ueyama et al. | |
| 2012/0065074 A1* | 3/2012 | Xie | H01L 39/143 505/234 |

(Continued)

OTHER PUBLICATIONS

Goyal, A., et al., "High critical current density superconducting tapes by epitaxial deposition of YBa2Cu3Ox thick films on biaxially textured metals," Appl. Phys. Lett., vol. 69, No. 12, Sep. 16, 1996, pp. 1795-1797.

(Continued)

*Primary Examiner* — Paul A Wartalowicz
(74) *Attorney, Agent, or Firm* — Blank Rome LLP

(57) ABSTRACT

An ultra-thin film superconducting tape and method for fabricating same is disclosed. Embodiments are directed to a superconducting tape being fabricated by processes which include removing a portion of the superconducting tape's substrate subsequent the substrate's initial formation, whereby a thickness of the superconducting tape is reduced to 15-80 μm.

18 Claims, 12 Drawing Sheets

(56) References Cited

U.S. PATENT DOCUMENTS

2012/0252680 A1  10/2012  Soo et al.

OTHER PUBLICATIONS

Iijima, Y., et al., "Biaxially Aligned YBa2Cu3O7-x Thin Film Tapes," Physica C 185-189 (1991), pp. 1959-1960.
Selvamanickam, V., et al., "High Performance 2G Wires: From R&D to Pilot-Scale Manufacturing," IEEE Transactions on Applied Superconductivity, vol. 19, No. 3, Jun. 2009, pp. 3225-3230.
Van der Laan, D. C., "YBa2Cu3O7—δ coated conductor cabling for low ac-loss and high-field magnet applications," Supercond. Sci. Technol. 22 (2009) 065013, pp. 1-5.
Wu, X. D., et al., "Properties of YBa2Cu3O7—δ thick films on flexible buffered metallic substrates," Appl. Phys. Lett., vol. 67, No. 16, Oct. 16, 1995, pp. 2397-2399.
International Search Report received in corresponding PCT Application No. PCT/US2016/031838, dated Sep. 22, 2016.
Progress of 2G HTS Wire Development at SuperPower, Sep. 5, 2016, 16 pages, Furukawa Electric Group, Denver, United States.

\* cited by examiner

ULTRA-THIN FILM SUPERCONDUCTING TAPES

CROSS REFERENCE TO RELATED APPLICATION(S)

This application is a national phase of PCT/US16/31838, filed May 11, 2016, which claims priority to U.S. provisional patent application No. 62/159,690, filed on May 11, 2015, both of which are hereby incorporated herein by reference in their entirety.

GOVERNMENT SPONSORSHIP

None.

FIELD OF THE DISCLOSURE

This disclosure relates to superconducting tapes, and more specifically to ultra-thin film type superconducting tapes.

BACKGROUND

Several materials systems are being developed to solve the looming problems associated with energy generation, transmission, conversion, storage, and use. Superconductors are a unique system that provides a solution across a broad spectrum of energy problems. Superconductors enable high efficiencies in generators, power transmission cables, motors, transformers and energy storage. Furthermore, superconductors transcend applications beyond energy to medicine, particle physics, communications, and transportation.

Superconducting tapes are becoming more and more popular. This is in part due to successful fabrication techniques that create epitaxial, single-crystal-like thin films on polycrystalline substrates (Y. Iijima, et al., *Physica C* 185, 1959 (1991); X. D. Wu, et al., *Appl. Phys. Lett.* 67, 2397 (1995); A. Goyal, et al., *Appl. Phys. Lett.* 69 (1996) p. 1795; V. Selvamanickam, et al., "High Performance 2G wire: From R&D to Pilot-scale Manufacturing", *IEEE Trans. Appl. Supercond.* 19, 3225 (2009)). In this technique, a thin film of materials having a rock salt crystal structure (e.g., MgO) is deposited by ion-beam assisted deposition over flexible, polycrystalline substrates. Superconducting films that are processed by this technique exhibit critical current densities comparable to that achieved in epitaxial films grown on single crystal substrates. Using this technique, several institutions have demonstrated pilot-scale manufacturing of superconducting composite tapes. Remarkably, single crystal-like epitaxial films are now being manufactured at lengths exceeding 1 km using a polycrystalline substrate base.

FIGS. 1A-1B illustrate a schematic and cross-sectional microstructure of a prior art high-temperature superconducting (HTS) thin film tape made via the afore-mentioned process. The tape typically includes several oxide films positioned on a metallic substrate and capped with silver and copper overlayers. A typical 2G HTS tape is around 0.1 to 0.2 mm thick, which is quite thick. The substrate itself comprises most of the tape's thickness, i.e., between 50 and 65%. For example, today, superconductor tape manufacturers typically use substrates ranging from 0.05 mm to 0.1 mm thick. The reason for this is to provide the tape with strength and stability during the extreme manufacturing conditions. For example, during manufacturing the tape is processed and subjected to temperatures of about 800° C. and high tensions on the order of a few Newtons. Additionally, because of challenges with thin substrates to achieve a low surface roughness and due to susceptibility to damage, the quality of the buffer and superconductor films may be compromised in thin tapes. It is noted that the thicknesses of the various layers in FIG. 1A are for illustrative purposes only and are not drawn to scale.

One major goal in superconducting tape manufacturing is to reduce the overall thickness of a superconducting tape. A 50% reduction in the thickness of the tape can increase the engineering current density ($J_e$) (i.e., critical current per unit cross section of the entire tape) by 50%. In one implementation, this increase in current density can result in higher ampere-turns in a coil, since more turns of superconducting tape can be fitted into a given coil volume. The result would be a higher magnetic field that can be generated by the coil, which is important for most superconductor applications such as superconducting magnetic energy storage (SMES) systems, high-field magnets, nuclear magnetic resonance spectroscopy (NMR), magnetic resonance imaging (MM), accelerators, generators and motors. In another implementation, thinner superconductor tapes can improve high current cables that are wound using these tapes on a flexible non-superconducting core (D. C. van der Laan, *Supercond. Sci. Technol.* 22, 065013 (2009)) or fabricated using a stack of tapes. For example, today, high current cables are made with 0.1 mm thick tapes. Due to the sheer size of the tape, the tape must be wound around a core having a diameter at least around 3 mm. However, because of the large core, the overall current density of the cable is severely compromised from a desired ~400 A/mm$^2$ at 4.2 K, 20 T (stand-alone tape) to levels of ~100 A/mm$^2$ at 4.2 K, 20 T. If thinner superconductor tapes can be manufactured, a smaller diameter core could be used which would result in a significantly higher overall current density.

Reducing superconductor tape thickness is challenging. About 97% of a superconductor tape is comprised of the substrate and the copper stabilizer. The copper stabilizer is not a viable target for reducing thickness, because it requires a sufficient thickness to provide stabilization of the conductor in the event of over current conditions. Hence, the only practical target for reducing tape thickness is the substrate. But fabricating a tape while using a thinner substrate presents several problems. First, tapes that are made on thin substrates can snap and break at the required high processing temperatures and tensions, which can greatly diminish the manufacturing yield. Second, every single step of the complex tape manufacturing process would need to be modified to accommodate different starting substrate thicknesses. Third, a tape manufacturer would need to produce several types of tapes, each with a different starting substrate thickness, to meet the requirements of different applications. This would increase the manufacturer's costs of production.

Thus, there is need in the art for methods and systems that can achieve ultra-thin film superconducting tapes.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

BRIEF SUMMARY

Figure 1A:
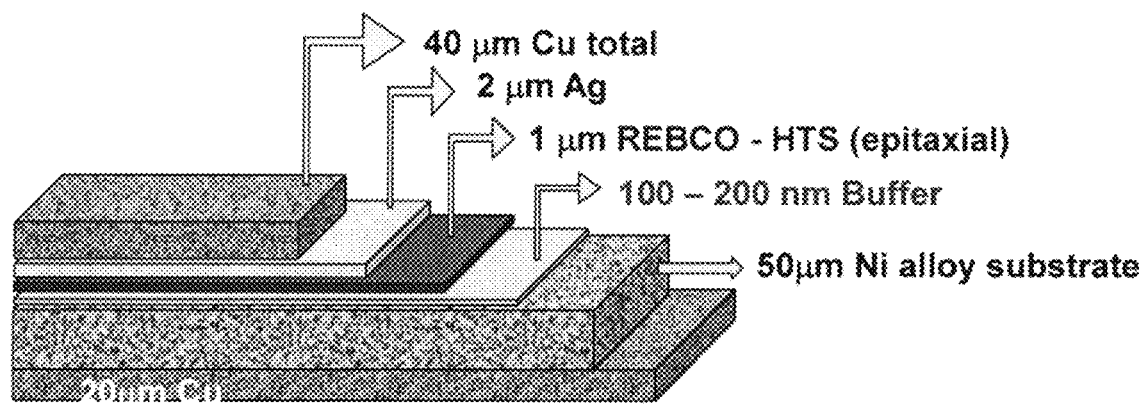
FIGS. 1A-1B illustrate a schematic and cross-sectional microstructure of a prior art thin film high-temperature superconducting tape.

Embodiments are directed to a superconductor tape. The superconductor tape comprises: a substrate; a buffer layer overlying the substrate; a superconductor layer overlying the buffer layer; and an overlayer overlying the superconductor layer. The superconductor tape has a thickness in a range of 15-30 μm.

In an embodiment, the substrate has a thickness in a range of 10 to 28 μm, the buffer layer has a thickness in a range of 0.1 to 2 μm, the superconductor layer has a thickness in a range of 0.5 to 5 μm, and the overlayer has a thickness in a range of 0.2 to 4 μm.

In an embodiment, the overlayer comprises silver (Ag) or gold (Au).

In an embodiment, the superconductor layer comprises a material selected from the group consisting of $REBa_2Cu_3O_{7-x}$, where RE is one of more elements selected from the group consisting of Y, Gd, Sm, Nd, Eu, Dy, Ho, Yb, Er, Tm, and Lu, and wherein $0 \leq x \leq 1$.

In an embodiment, the buffer layer comprises a material selected from the group consisting of MgO, $LaMnO_3$, $CeO_2$, $Gd_2Zr_2O_7$, YSZ, $SrTiO_3$, and combinations thereof.

In an embodiment, the substrate comprises a metal selected from the group consisting of Hastelloy, Stainless Steel, Ni—W, Inconel, metallic glasses, and combinations thereof.

In an embodiment, the superconducting tape has an engineering current density of at least 700 $A/mm^2$ at 77 K.

In an embodiment, the superconductor tape may further comprise a conductive layer overlying the overlayer. The conductive layer may have a thickness of 2 μm to 50 μm yielding an overall tape thickness of 15 to 80 μm.

In an embodiment, the conductive layer comprises copper (Cu) or at least one Cu alloy or a conductive metal alloy.

In an embodiment, the superconductor tape may further comprise a second overlayer below the substrate, and a second conductive layer below the second overlayer.

Embodiments are also directed to a superconductor wire. The superconductor wire comprises: a core having a diameter of at least 0.5 mm; and a stack of superconductor tapes spiral wound around the core. The stack of superconductor tapes have an outside diameter between 0.7 mm and 3 mm while wound around the core.

Embodiments are further directed to a method for fabricating a superconducting tape. The method comprises: providing a substrate; depositing a buffer layer on the substrate; forming a superconducting layer on the buffer layer; placing an overlayer on the superconducting layer; and removing a portion of the substrate subsequent the depositing, forming, placing, and positioning steps, whereby a thickness of the superconducting tape is reduced to 15-80 μm.

In an embodiment, the removing is performed via a mechanical abrading process such as by using at least one grinding wheel, via a chemical etching process, or via a electrolytic etching process.

In an embodiment, subsequent to the removing step, the substrate has a thickness in a range of 10-75 μm, the deposited buffer layer has a thickness in a range of 0.1-2 μm, the formed superconductor layer has a thickness in a range of 0.5-5 μm, and the placed overlayer has a thickness in a range of 0.5-4 μm.

In an embodiment, the overlayer comprises silver (Ag) or gold (Au).

In an embodiment, the superconductor layer comprises a material selected from the group consisting of $REBa_2Cu_3O_{7-x}$, where RE is one of more elements selected from the group consisting of Y, Gd, Sm, Nd, Eu, Dy, Ho, Yb, Er, Tm, and Lu, and wherein $0 \leq x \leq 1$.

In an embodiment, the buffer layer comprises a material selected from the group consisting of MgO, $LaMnO_3$, $CeO_2$, $Gd_2Zr_2O_7$, YSZ, $SrTiO_3$, and combinations thereof.

In an embodiment, the substrate comprises a metal selected from the group consisting of Hastelloy, Stainless Steel, Ni—W, Inconel, metallic glasses, and combinations thereof.

In an embodiment, the superconducting tape has an engineering current density of at least 250 $A/mm^2$ at 77 K, subsequent the removing step.

In an embodiment, the method may further comprise positioning a conductive layer on the overlayer, wherein the conductive layer has a thickness of 2 μm to 50 μm yielding an overall tape thickness of 15 to 80 μm.

In an embodiment, the conductive layer comprises copper (Cu) or at least one Cu alloy or a conductive metal alloy.

In an embodiment, the method may further comprise placing a second overlayer below the substrate, and positioning a second conductive layer below the second overlayer.

DETAILED DESCRIPTION

It is to be understood that the figures and descriptions of the present invention may have been simplified to illustrate elements that are relevant for a clear understanding of the present invention, while eliminating, for purposes of clarity, other elements found in a typical superconductor tape or typical method for fabricating a superconductor tape. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will be made to the drawings wherein like structures are provided with like reference designations.

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented devices, systems, methods, features, and advantages will be or become apparent to one with skill in the art upon examining the drawings and the detailed description herein. It's intended that all such additional devices, systems, methods, features, and advantages be protected by the accompanying claims.

For purposes of this disclosure, the terms "film" and "layer" may be used interchangeably.

It is an objective of the embodiments described herein to achieve an ultra-thin film HTS tape.

In an embodiment, an ultra-thin film HTS tape includes an overall thickness without copper stabilizer in the range of 15-30 μm, and preferably ~25 μm. In another embodiment, an ultra-thin film HTS tape may be achieved by reducing the tape's substrate thickness after the superconductor film is deposited on the substrate. In still another embodiment, an ultra-thin film HTS tape may exhibit an engineering current density in the range of 700-16,000 A/mm$^2$, and preferably above 800 A/mm$^2$ at 77K, in a zero applied field. In yet still another embodiment, a critical current of 210 A/cm-width with a 30 micron tape yields a current density ($J_e$) of ~700 A/mm$^2$.

Figure 2:
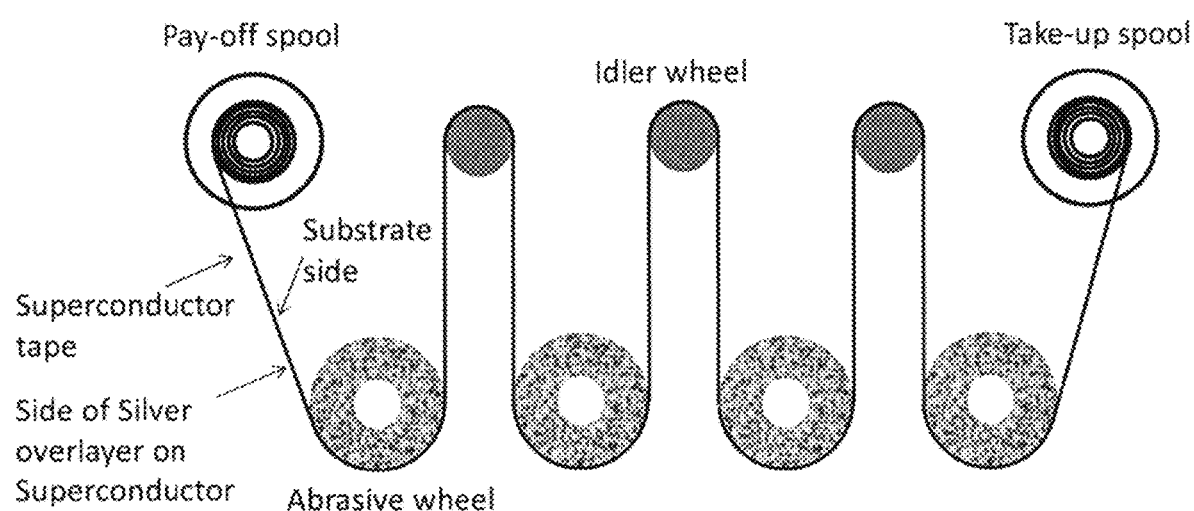
FIG. 2 illustrates an apparatus for mechanically abrading a tape substrate, in accordance with an embodiment.

In one embodiment, an ultra-thin film HTS tape may be achieved by mechanically abrading or chemically etching the substrate of an HTS tape after the silver overlayer and superconductor films are deposited on the substrate. FIG. 2, by way of example only, illustrates an apparatus for mechanically abrading an HTS's substrate. The substrate side of the tape may be passed over one or more abrasive grinding wheels that include appropriate grit sizes. For example, in one embodiment the wheels may be made of one or more of silicon carbide and diamond having grit sizes of 48, 60, 80, and 120. The grinding wheels may remove portions of the substrate via mechanical abrasion. Each wheel may have the same grit or successively different grit sizes.

Copper layer may preferably be added after the substrate removal step. Alternatively, the tape may be initially provided with a copper stabilizer on the superconductor side only (i.e., on the silver overlayer) or even on both sides (i.e., the superconductor side and substrate side). This latter approach would then require removing both the substrate portion and copper that was previously formed on the substrate.

In yet another embodiment, the grinding process is conducted in both the forward and reverse directions in order to uniformly abrade the substrate along the HTS tape length and width. In still another embodiment, the speed of the grinding wheels, the tape movement speed, and/or the tape tension are optimized in combination to maintain the performance and uniformity of the HTS tape. For example, in one embodiment, the wheels may be rotated between 100 and 2000 rpm. In another embodiment, the linear speed of the tape may range from 5 m/h to 200 m/h. In yet another embodiment, the tape tension may range from 2 N to 100 N.

In an embodiment, abrasion of the substrate of an HTS tape, in accordance with any of the aforementioned embodiments, may remove ~20 to 40 μm substrate from a standard HTS tape having an initial overall thickness of 55 μm including a silver overlayer and with no copper stabilizer, resulting in an HTS tape with a thickness of ~15 to 35 μm. In yet another embodiment, abrading the substrate of an HTS tape with an initial critical current of 250 A/cm-width at 77 K, 0 T, in accordance with any of the aforementioned embodiments, may result in HTS tapes with engineering current densities between about 700 A/mm$^2$ and 1650 A/mm$^2$. Abrading the substrate of an HTS tape with an initial critical current of 500 A/cm-width at 77 K, 0 T, in accordance with any of the aforementioned embodiments, may result in HTS tapes with engineering current densities between about 1400 A/mm$^2$ and 3300 A/mm$^2$. Similarly, abrasion of the substrate of an HTS tape, in accordance with any of the aforementioned embodiments, may remove ~25 to 75 μm substrate from a 105 μm thick HTS tape with a 100 μm substrate including a silver overlayer and without a conductive layer, resulting in an HTS tape with a thickness ~30 to 80 μm. Thus, depending on the removal technique, thickness of the superconducting tape may be reduced to 15-80 μm.

Figure 3:
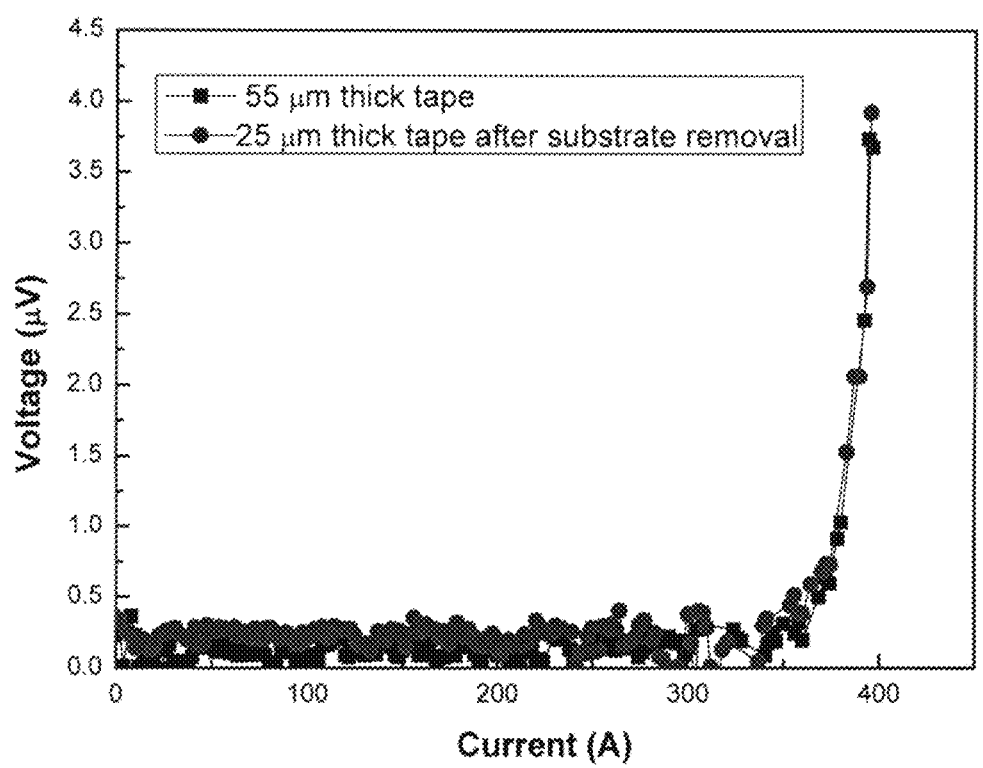
FIG. 3 illustrates critical current measurements of tapes without copper stabilizers, before and after substrate abrasion, in accordance with an embodiment.

FIG. 3, by way of example only, illustrates critical current measurements of HTS tapes including a silver overlayer and without copper stabilizers, before and after substrate abrasion in accordance with the above-described embodiments. The tapes are tested at 77K in a zero applied magnetic field. In an embodiment, a substantial reduction in HTS tape thickness may be achieved without impacting the critical current density of the super conducting tape. For example, the critical current of the tape before and after substrate abrasion is virtually identical at 378 A/12 mm width, which corresponds to an engineering current density of 1260 A/mm$^2$. This is significantly higher than the engineering critical current density of the original tape, or 572 A/mm$^2$.

Ultra-thin HTS tapes made in accordance with any of the aforementioned processes may be used to fabricate high current density wires or cables by winding the tape around cores (such as brass or other metal) having small diameters in the range of approximately 0.5 mm to 2 mm. In one embodiment, after the substrate removal process, 5 μm of copper stabilizer may be electrodeposited onto the silver overlayer of a 2 mm wide, 25 μm thick HTS tape made in accordance with any of the aforementioned processes (i.e., resulting in a 30 μm thick ultra-thin film HTS tape).

Figure 4:
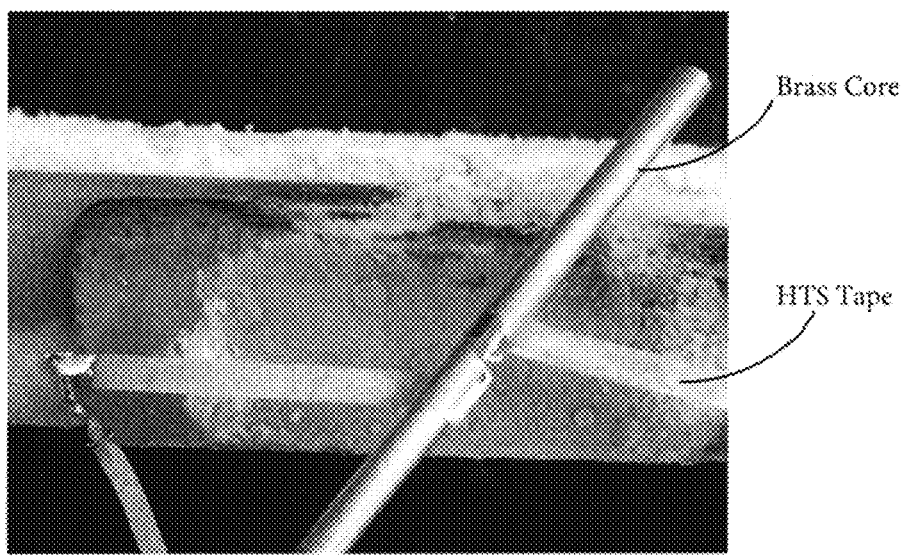
FIG. 4 illustrates an ultra-thin film HTS tape wound around a brass core, in accordance with an embodiment.
Figure 5:
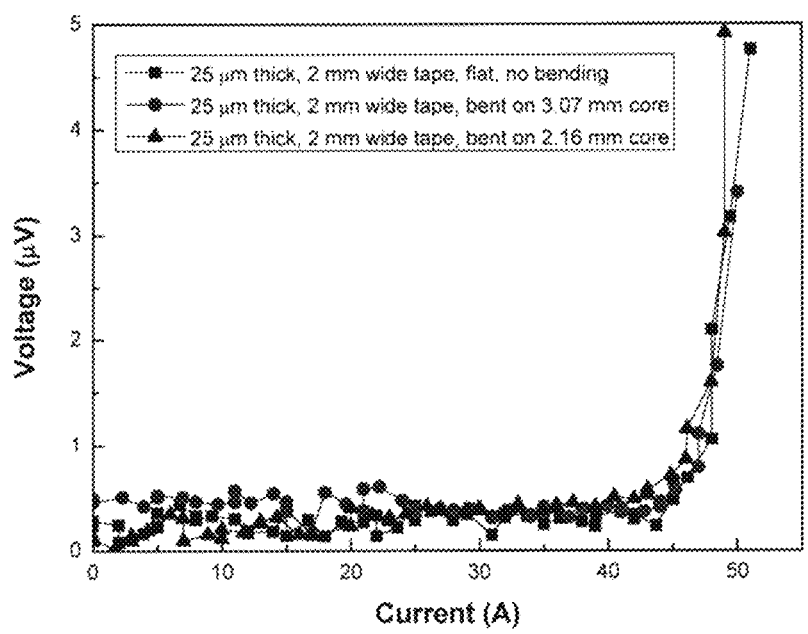
FIG. 5 illustrates critical current measurements for an ultra-thin film HTS tape wound around a brass core, in accordance with an embodiment.

FIG. 4, by way of example only, illustrates a 30 μm thick ultra-thin film HTS tape (including a silver overlayer and overlying copper layer) wound around a brass core having a ~2.16 mm diameter. In an embodiment, the critical current of an ultra-thin film HTS tape is substantially the same when the tape is flat or when the tape is wound around a brass core. FIG. 5, by way of example only, illustrates critical current measurements for the ultra-thin film HTS tape described in FIG. 4 laid flat, wound around a 3.07 mm diameter brass core, and wound around a 2.16 mm diameter brass core. The tapes are tested at 77 K in a zero-applied magnetic field. In embodiments, the three different arrangements of the tape exhibit substantially the same critical current. For these three arrangements, the critical current remained unchanged between 47-48 A in the 2 mm wide tapes.

Figure 6:
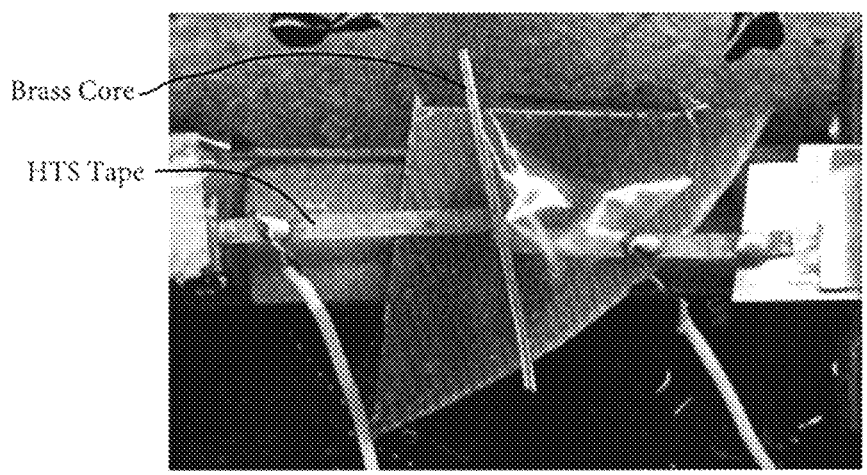
FIG. 6 illustrates an ultra-thin film HTS tape wound around a brass core, in accordance with an embodiment.

Many typical superconductor tapes include ~20 μm thick of copper stabilizer on the superconducting side of the tape. In another embodiment, 20 μm of copper stabilizer may be electrodeposited onto a 2 mm wide, 25 μm thick HTS tape made in accordance with the afore-mentioned processes (i.e., resulting in a 45 μm thick ultra-thin film HTS tape). In this case, copper may be deposited on the superconductor side atop the silver overlayer, and a lesser amount/thickness of copper may optionally also be deposited on the substrate side. This ultra-thin film HTS tape may be wound around brass cores having small diameters in the range of approximately 0.5 mm to 2 mm. FIG. 6, by way of example only, illustrates a 45 μm thick ultra-thin film HTS tape wound around a brass core with a ~1.1 mm diameter.

Figure 7:
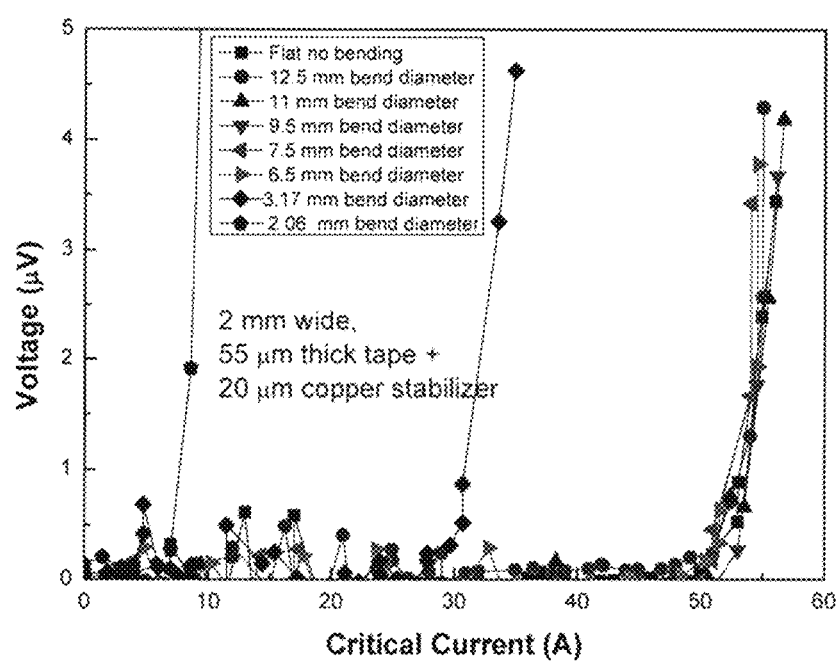
FIG. 7 illustrates critical current measurements for standard HTS tapes having copper stabilizer, in accordance with an embodiment.

FIG. 7, by way of example only, illustrates critical current measurements for standard 2 mm wide HTS tapes having ~20 μm thick of copper stabilizer and a total thickness of ~75 μm. The tapes are laid flat and wound around brass cores having diameters between approximately 2.06 mm and 12.5 mm. The tapes are tested at 77 K in a zero applied magnetic field. In an embodiment, the critical current remains unchanged between 6.5 mm and 12.5 mm. However, the critical current drops by 42% when the tape is wound around a brass core having a diameter of 3.17 mm, and drops by a total of 85% when the tape is wound around a brass core having a diameter of 2.06 mm.

Figure 8:
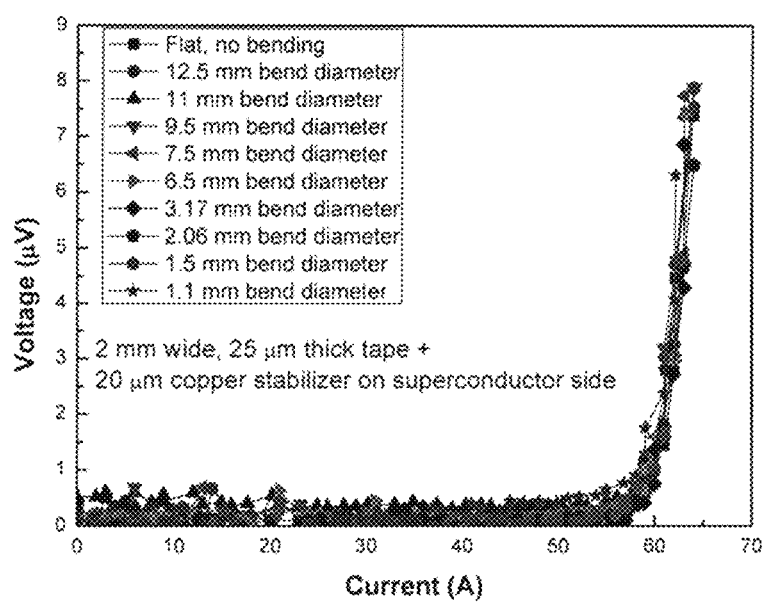
FIG. 8 illustrates critical current measurements for an ultra-thin film HTS tape wound around a brass core, in accordance with an embodiment.

FIG. 8, by way of example only, illustrates critical current measurements for the ultrathin film HTS tape described in FIG. 6 and made in accordance with any of the aforementioned processes. The tapes are laid flat, or wound around brass cores having diameters between approximately 1.1 mm and 12.5 mm. The tapes are tested at 77 K in a zero applied magnetic field. Unlike the standard tapes in FIG. 7, ultra-thin film HTS described herein maintain substantially the same critical current all the way down to the 1.1 mm diameter bend.

In an embodiment, substantially small diameter HTS wires in the range of approximately 0.7 to 3 mm in outer diameter may be manufactured using the ultra-thin film HTS tapes described herein. In another embodiment, HTS wires having diameters between approximately 0.7 mm to 5 mm may be manufactured using the ultra-thin film HTS tapes described herein.

Figure 9:
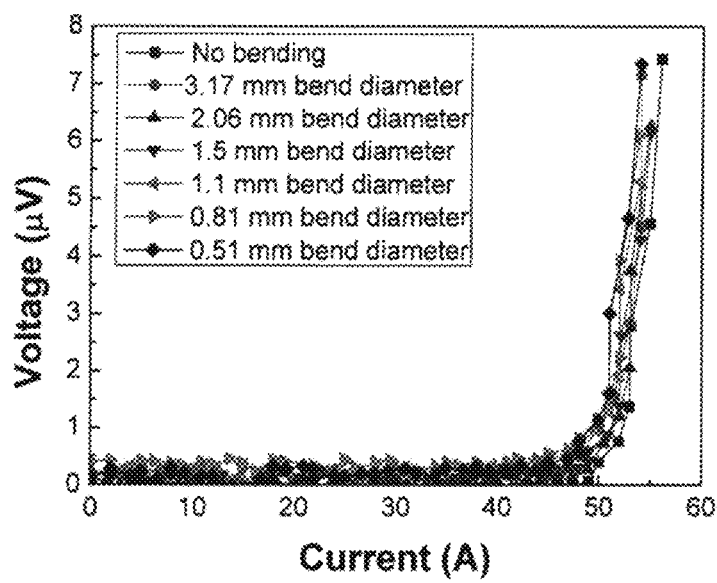
FIG. 9 illustrates critical current measurements for an ultra-thin film HTS tape wound around a brass core from 3.17 mm diameter down to 0.51 mm diameter, in accordance with an embodiment.

Ultrathin superconductor tapes have been tested at even smaller bend diameters. FIG. 9, by way of example only, shows current-voltage characteristics of $I_c$ measurements of 2 mm wide, 25 μm thick REBCO tapes (including a silver overlayer) that underwent substrate removal via any of the aforementioned processes, and with an additional 20 μm layer of Cu stabilizer on the superconductor side atop the silver overlayer (resulting in a total superconducting tape thickness of 45 μm) when bent around brass cores from 3.17 mm diameter down to 0.51 mm diameter. Remarkably, the ultrathin superconductor tapes exhibited no degradation in critical current even when wound on 0.51 mm diameter cores. Another copper layer may optionally also be provided in a lesser amount/thickness on the substrate side. To facilitate copper deposition on the substrate side, a thin layer (~0.5 μm thick) Ag layer may optionally be deposited first.

Figure 10A:
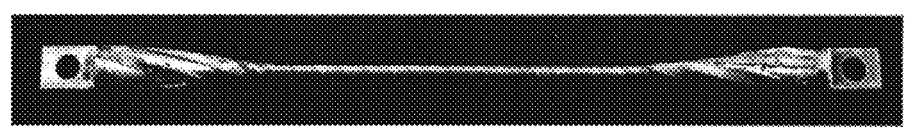
FIG. 10A illustrates a rare earth barium copper oxide (REBCO) wire made by spiral winding six layers of 45 μm thick tapes over a 0.8 mm diameter former.
Figure 10B:
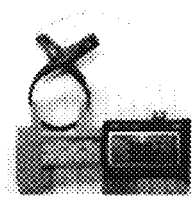
FIG. 10B illustrates the REBCO wire shown in FIG. 10A after being bent to a diameter of 3 cm.

The ultrathin tapes may be bent on very small formers/cores discussed above may now be utilized to fabricate round, small-diameter REBCO wires. Round REBCO wires have been successfully fabricated with six layers of 2 mm wide, 45 μm thick tapes (including a 3 μm thick silver overlayer and an overlying 20 μm thick Cu stabilizer only on the superconductor side) on a 0.8 mm diameter former/core as shown in FIG. 10A which, by way of example only, illustrates a 1.6 mm outside diameter round REBCO wire made by spiral winding six layers of 45 μm thick tapes over a 0.8 mm diameter former. A pitch of 2.8 mm was used. This round REBCO wire was able to sustain a critical current of 283 A at 77 K, 0 T which corresponds to a current density ($J_e$) of 140 A/mm$^2$. Additionally, no degradation in critical current ($I_c$) was found even when the wire was bent around a diameter of 3 cm. FIG. 10B, by way of example only, illustrates the round wire after being bent to a diameter of 3 cm.

Figure 11:
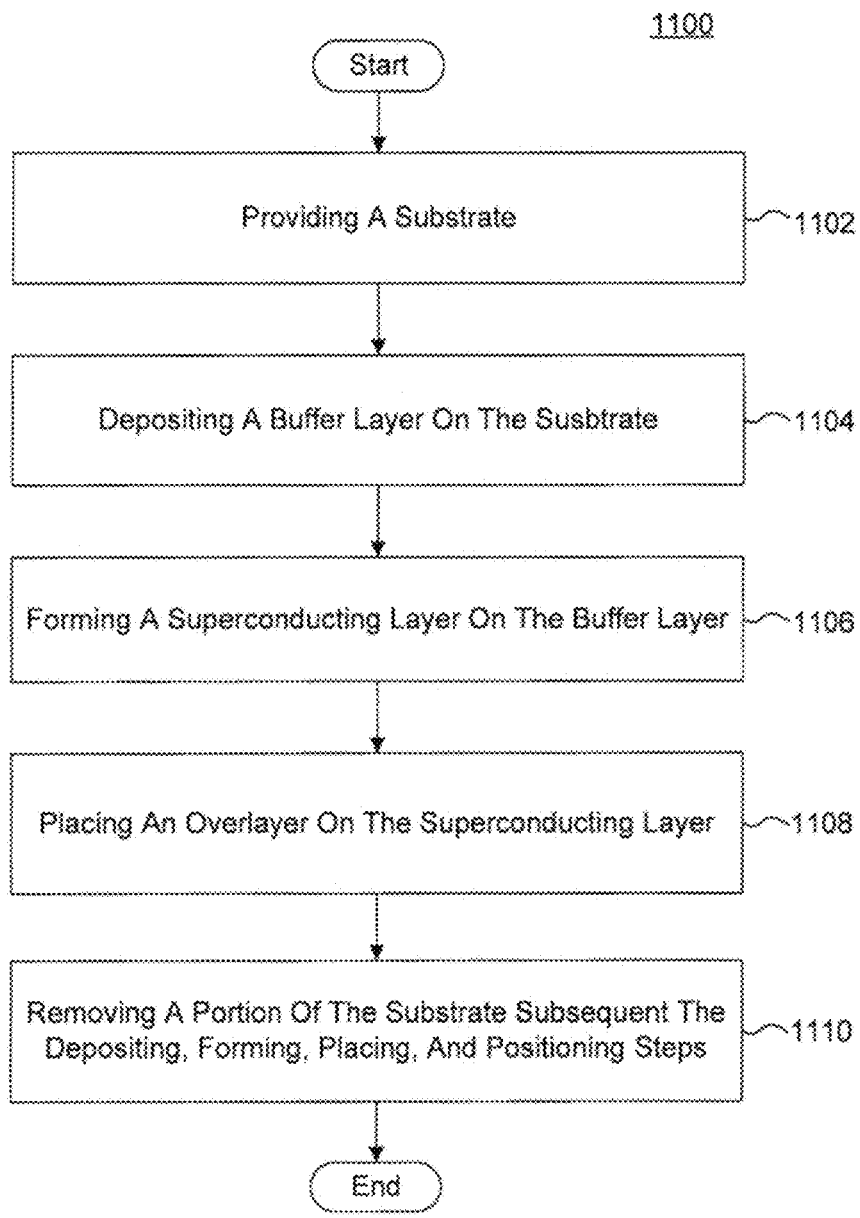
FIG. 11 is a flowchart illustrating an embodiment of a method for fabricating a superconducting tape, in accordance with an embodiment.

FIG. 11 is a flowchart illustrating an embodiment of a method 1100 for fabricating a superconductor tape. In an embodiment, a substrate may be provided (block 1102). Examples of substrates may include Hastelloy, Stainless Steel, Ni—W, Inconel, and metallic glasses. A buffer layer may then be deposited on the substrate (block 1104). Examples of buffer layers may include MgO, LaMnO$_3$, CeO$_2$, Gd$_2$Zr$_2$O$_7$, YSZ and SrTiO$_3$. A superconducting layer is then formed on the buffer layer (block 1106) via a process such as Metal Organic Chemical Vapor Deposition, Pulsed Laser Deposition, Reactive Co-evaporation, Metal Organic Deposition and Chemical Solution Deposition. Examples of superconducting layers may include REBa$_2$Cu$_3$O$_{7-x}$ (REBCO, RE=rare earth including Y, Gd, Sm, Nd, Eu, Dy, Ho, Yb, Er, Tm, Lu). Next, an overlayer may be placed on the superconducting layer (block 1108). Examples of overlayers may include silver (Ag) or Gold (Au). After the depositing, forming, and placing, steps (i.e., blocks 1104, 1106, 1108) are performed, a portion of the substrate is then removed (block 1110), whereby a thickness of the superconducting tape may be reduced to 15-80 μm. The removal of the portion of the substrate is performed via a process selected from the group consisting of a mechanical abrading process, a chemical etching process, an electrolytic etching process, and combinations thereof. Next, an optional conductive layer may be positioned on the overlayer or all around the tape. Examples of conductive layers may include copper (Cu), or at least one copper alloy or a conductive metal alloy. To facilitate copper deposition on the substrate side, a thin layer (~0.5 μm thick) Ag layer may optionally be deposited first. Alternatively, after removal of a portion of the substrate, the tape may be slit to narrow its width, deposited with a second thin layer of silver on the superconductor side and edges followed by conductive layer deposition atop the second silver layer. It may be preferable to deposit the copper layer on the superconductor side atop the second silver overlayer. Another conductive layer may optionally also be provided in a lesser amount/thickness on the substrate side. To facilitate conductive layer deposition on the substrate side, a thin layer (~0.5 μm thick) Ag layer may optionally be deposited first. It is noted that there preferably may always be an overlayer layer such as silver on the superconductor side prior to substrate portion removal.

Figure 1B:
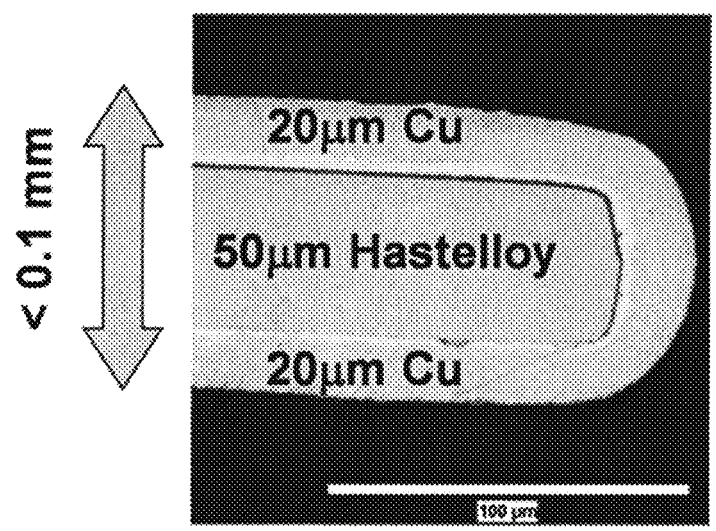

Although the embodiments in method 1100 are described above with reference to deposition, forming, and placing of various layers, the deposition, forming, and placing of any or all of the above-mentioned layers is hereby defined to include epitaxial growth (or any other layer formation technique described above or otherwise known to one skilled in the art) of any of the layers. Furthermore, it's understood that method 1100 may implement any of the materials and processes described above with respect to FIG. 1.

While results on thin superconductor tapes prepared by a mechanical abrasion method have been disclosed, similar results are expected in thin profile superconductor tapes prepared by chemical etching of the substrate after deposition of the superconductor layer and overlayer. For example, in one embodiment, etching of the Hastelloy substrate could be performed using a solution of, for example, hydrochloric acid, acetic acid and nitric acid. After etching, the HTS tape may be cleaned with, for example, water and methanol and then dried. Immersion etching of Hastelloy substrate is feasible using a solution of, for example, chromic acid and hydrochloric acid. In another embodiment, electrolytic etching of the Hastelloy substrate may also be performed using a solution of, for example, oxalic acid and hydrochloric acid. In still another embodiment, electrolytic etching may also be done in a cell containing, for example, a carbon cathode and a stainless steel anode.

There may be at least two optional configurations for using the ultra-thin superconductor tape. In a first option, the ultra-thin tape may be used as is after substrate removal or with a conductive stabilizer layer. The conductive stabilizer layer may be deposited on the silver overlayer atop the superconductor layer. The conductive stabilizer layer may also be deposited on the substrate side after substrate removal. In this case, this would most likely require a deposition of a thin silver layer (<0.5 µm) on the substrate side for ease of conductive layer deposition on the substrate side. This option may be used for employing the ultra-thin tapes as flat tapes. In a second option, after substrate removal, a slit of the tape to narrow the tape width (~2 mm) is performed if necessary, followed by a deposit of a second thin silver layer (<0.5 µm) on the superconducting side, and then a deposit of a conductive layer stabilizer on this silver layer on the superconducting side. Also, after slitting following substrate removal, silver needs to be deposited to protect the edges. By slitting the ultra-thin tapes, this option may be used for converting the ultra-thin tapes into round wires. The starting superconductor tape has a silver layer on the superconducting side prior to substrate removal. In both options, a thin silver layer would likely be deposited after substrate removal to facilitate copper electrodeposition if Cu is deposited on all sides.

Figure 12:
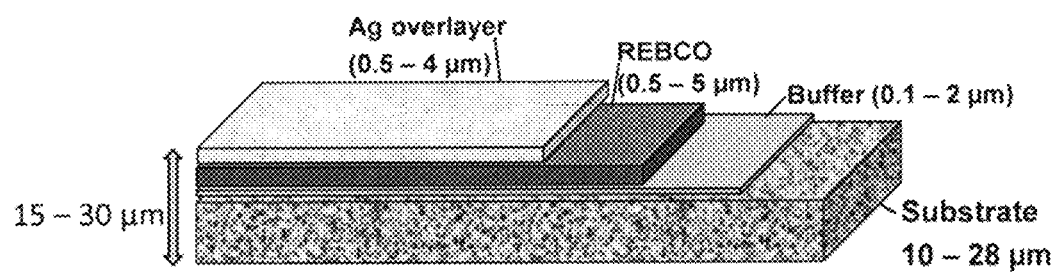
FIG. 12 illustrates a schematic and cross-sectional microstructure of an ultra-thin film high-temperature superconducting tape without the implementation of a copper layer, in accordance with an embodiment.

FIG. 12 illustrates a schematic architecture of an ultra-thin film high-temperature superconducting tape without the implementation of a conductive layer, in accordance with an embodiment.

Figure 13:
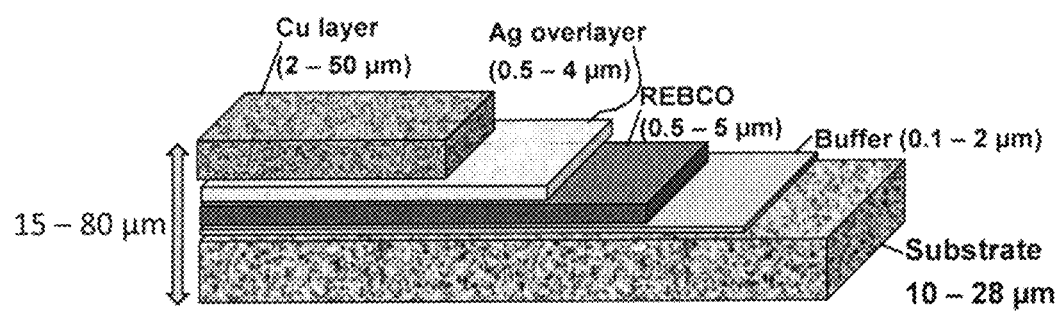
FIG. 13 illustrates a schematic and cross-sectional microstructure of an ultra-thin film high-temperature superconducting tape including a copper layer on the silver overlayer, in accordance with an embodiment.

FIG. 13 illustrates a schematic architecture of an ultra-thin film high-temperature superconducting tape including a conductive layer (in this case a copper layer) on the silver overlayer, in accordance with an embodiment.

While FIG. 12 illustrates a superconducting tape without a conductive layer and FIG. 13 illustrates a superconducting tape with a copper layer, there may be many different alternative configurations. Some alternative examples are as follows: no Cu after substrate removal, Cu deposition on superconductor side only after substrate removal, Cu deposition all around the tape after substrate removal plus starting with a thicker substrate (for example, ~100 µm instead of ~50 µm) along with the different Cu options. FIG. 12 and FIG. 13 respectively illustrate no Cu after substrate removal and Cu on superconductor side only after substrate removal. A preferred embodiment at this time is a 45 µm thick tape with a 20 µm Cu layer on the superconductor side after substrate removal to reduce tape thickness from 55 µm to 25 µm.

Embodiments are directed to a superconductor tape. The superconductor tape comprises: a substrate; a buffer layer overlying the substrate; a superconductor layer overlying the buffer layer; and an overlayer overlying the superconductor layer. The superconductor tape has a thickness in a range of 15-30 µm.

In an embodiment, the substrate has a thickness in a range of 10 to 28 µm, the buffer layer has a thickness in a range of 0.1 to 2 µm, the superconductor layer has a thickness in a range of 0.5 to 5 µm, and the overlayer has a thickness in a range of 0.2 to 4 µm.

In an embodiment, the overlayer comprises silver (Ag) or gold (Au).

In an embodiment, the superconductor layer comprises a material selected from the group consisting of $REBa_2Cu_3O_{7-x}$, where RE is one of more elements selected from the group consisting of Y, Gd, Sm, Nd, Eu, Dy, Ho, Yb, Er, Tm, and Lu, and wherein $0 \leq x \leq 1$.

In an embodiment, the buffer layer comprises a material selected from the group consisting of $MgO$, $LaMnO_3$, $CeO_2$, $Gd_2Zr_2O_7$, YSZ, $SrTiO_3$, and combinations thereof.

In an embodiment, the substrate comprises a metal selected from the group consisting of Hastelloy, Stainless Steel, Ni—W, Inconel, metallic glasses, and combinations thereof.

In an embodiment, the superconducting tape has an engineering current density of at least 700 $A/mm^2$ at 77 K.

In an embodiment, the superconductor tape may further comprise a conductive layer overlying the overlayer. The conductive layer may have a thickness of 2 µm to 50 µm yielding an overall tape thickness of 15 to 80 µm.

In an embodiment, the conductive layer comprises copper (Cu) or at least one Cu alloy or a conductive metal alloy.

In an embodiment, the superconductor tape may further comprise a second overlayer below the substrate, and a second conductive layer below the second overlayer.

Embodiments are also directed to a superconductor wire. The superconductor wire comprises: a core having a diameter of at least 0.5 mm; and a stack of superconductor tapes spiral wound around the core. The stack of superconductor tapes have an outside diameter between 0.7 mm and 3 mm while wound around the core.

Embodiments are further directed to a method for fabricating a superconducting tape. The method comprises: providing a substrate; depositing a buffer layer on the substrate; forming a superconducting layer on the buffer layer; placing an overlayer on the superconducting layer; and removing a portion of the substrate subsequent the depositing, forming, placing, and positioning steps, whereby a thickness of the superconducting tape is reduced to 15-80 µm.

In an embodiment, the removing is performed via a mechanical abrading process such as by using at least one grinding wheel, via a chemical etching process, or via a electrolytic etching process.

In an embodiment, subsequent to the removing step, the substrate has a thickness in a range of 10-75 µm, the deposited buffer layer has a thickness in a range of 0.1-2 µm, the formed superconductor layer has a thickness in a range of 0.5-5 μm, and the placed overlayer has a thickness in a range of 0.5-4 μm.

In an embodiment, the overlayer comprises silver (Ag) or gold (Au).

In an embodiment, the superconductor layer comprises a material selected from the group consisting of $REBa_2Cu_3O_{7-x}$, where RE is one of more elements selected from the group consisting of Y, Gd, Sm, Nd, Eu, Dy, Ho, Yb, Er, Tm, and Lu, and wherein $0 \leq x \leq 1$.

In an embodiment, the buffer layer comprises a material selected from the group consisting of MgO, $LaMnO_3$, $CeO_2$, $Gd_2Zr_2O_7$, YSZ, $SrTiO_3$, and combinations thereof.

In an embodiment, the substrate comprises a metal selected from the group consisting of Hastelloy, Stainless Steel, Ni—W, Inconel, metallic glasses, and combinations thereof.

In an embodiment, the superconducting tape has an engineering current density of at least 250 $A/mm^2$ at 77 K, subsequent the removing step.

In an embodiment, the method may further comprise positioning a conductive layer on the overlayer, wherein the conductive layer has a thickness of 2 μm to 50 μm yielding an overall tape thickness of 15 to 80 μm.

In an embodiment, the conductive layer comprises copper (Cu) or at least one Cu alloy or a conductive metal alloy.

In an embodiment, the method may further comprise placing a second overlayer below the substrate, and positioning a second conductive layer below the second overlayer.

Although embodiments are described above with reference to an overlayer comprising silver (which may be optional), overlayers comprising any suitable composition such as silver or gold may alternatively be employed as part of the superconducting tape, and may therefore utilize the advantages of the configurations and embodiments described above.

Also, although embodiments are described above with reference to a conductive layer comprising copper (which may be optional), conductive layers comprising any suitable composition such as copper or copper alloys or conductive metal alloys may alternatively be employed as part of the superconducting tape, and may therefore utilize the advantages of the configurations and embodiments described above.

Features in any of the embodiments described above may be employed in combination with features in other embodiments described above, such combinations are considered to be within the spirit and scope of the present invention.

The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

EXAMPLES

Example 1

Proof of concept experiments were conducted in a laboratory-scale reel-to-reel apparatus with two grinding wheels that rotated at a speed of 240 RPM in opposite directions (clockwise and counter-clockwise). The rear substrate surface of a 0.055 mm thick HTS tape including a silver overlayer was abraded over the two 60 grit grinding wheels, at a linear tape speed of about 10 cm/min. After each pass of mechanical abrasion, the direction of the tape was reversed. After 12 passes, the mechanical abrasion was continued with two 120 grit grinding wheels at a linear tape speed of about 10 cm/min. The tape direction was reversed after each pass and a total of four passes were completed. The thickness of the tape was measured at different locations along the tape width and length. The thickness of the HTS tape was found to be reduced to 0.02-0.025 mm. The critical current of the tape was tested using transport current in a four-probe set up. The critical current of the ground 0.025 mm tape was measured to be the same as the critical current of the parent 0.055 mm tape, at 360 A.

Example 2

The experiment detailed above in Example 1 was repeated with another 0.055 mm thick HTS tape including a silver overlayer that was mechanical abraded on the rear substrate side at a linear tape speed of about 10 cm/min. In this example, the tape was abraded in 10 passes (with reversal of direction after each pass) over two 60 grit grinding wheels. Then the 60 grit wheels were replaced with two 80 grit grinding wheels and the tape was further abraded in 9 passes (with reversal of direction after each pass). The thickness of the HTS tape was found to be reduced to 0.02-0.025 mm. The critical current of the ground ~0.025 mm tape was measured to be the same as the critical current of the parent 0.055 mm tape, at 378 A.

Example 3

A HTS tape including a silver overlayer (with no copper) on the superconductor side was mechanically-abraded to 0.025 mm thickness as described in either of the two examples above. The HTS tape was then slit to 2 mm width. Another (second) thin layer of silver (<1 μm) was deposited on the slit tape atop the original silver layer on the superconductor side. The second silver layer is deposited to cover, inter alia, the slit edges as well as to facilitate copper deposition on the superconductor side. A 20 μm thickness of copper was electroplated on the silver surface of the tape atop the second/another silver layer on the superconductor side using a copper nitrate solution. The solution contained 100 g of copper nitrate in 1 L of methanol. A plating current of 400 mA and a plating time of 5 minutes were used. The thickness of the copper-plated tape was measured to be 0.045 mm. The critical current of the tape was measured using transport current with a four-probe method. The critical current at 77 K, zero field was measured to be 59 A. The copper-plated tape was wound around a 1.1 mm diameter brass core and the critical current was measured again in a bent state. The critical current of the wound tape was found to be almost 59 A indicating no degradation was present. It is noted that another silver and copper layer may optionally be added to the substrate side after substrate portion removal as described in the embodiments above.

What is claimed is:

1. A superconductor tape comprising:
a substrate;
a buffer layer overlying the substrate;
a superconductor layer overlying the buffer layer; and
an overlayer overlying the superconductor layer;
wherein the superconductor tape has a thickness in a range of 15—23 µm and an engineering current density of above 800 A/mm$^2$ at 77 K, 0 T.

2. The superconductor tape of claim 1, wherein the buffer layer has a thickness in a range of 0.1 to 2 µm, the superconductor layer has a thickness in a range of 0.5 to 5 µm, and the overlayer has a thickness in a range of 0.2 to 4 µm.

3. The superconductor tape of claim 1, wherein the overlayer comprises silver (Ag) or gold (Au).

4. The superconductor tape of claim 1, wherein the superconductor layer comprises a material selected from the group consisting of $REBa_2Cu_3O_{7-x}$, where RE is one of more elements selected from the group consisting of Y, Gd, Sm, Nd, Eu, Dy, Ho, Yb, Er, Tm, and Lu, and wherein $0 \leq x \leq 1$.

5. The superconductor tape of claim 1, wherein the buffer layer comprises a material selected from the group consisting of MgO, $LaMnO_3$, $CeO_2$, $Gd_2Zr_2O_7$, YSZ, $SrTiO_3$, and combinations thereof.

6. The superconductor tape of claim 1, wherein the substrate comprises a metal selected from the group consisting of Hastelloy, Stainless Steel, Ni-W, Inconel, metallic glasses, and combinations thereof.

7. The superconductor tape of claim 1, further comprising a conductive layer overlying the overlayer.

8. The superconductor tape of claim 7, wherein the conductive layer comprises copper (Cu) or at least one Cu alloy or a conductive metal alloy.

9. The superconductor tape of claim 7, further comprising a second overlayer and a second conductive layer, wherein the substrate is positioned between the buffer layer and the second overlayer, and the second overlayer is positioned between the substrate and the second conductive layer.

10. A superconductor tape comprising:
a substrate;
a buffer layer overlying the substrate;
a superconductor layer overlying the buffer layer; and
an overlayer overlying the superconductor layer;
wherein the substrate has a thickness in a range of 10—22 µm and the superconductor tape has an engineering current density of above 800 A/mm$^2$ at 77 K, 0 T.

11. The superconductor tape of claim 10, wherein the buffer layer has a thickness in a range of 0.1 to 2 µm, the superconductor layer has a thickness in a range of 0.5 to 5 µm, and the overlayer has a thickness in a range of 0.2 to 4 µm.

12. The superconductor tape of claim 10, wherein the overlayer comprises silver (Ag) or gold (Au).

13. The superconductor tape of claim 10, wherein the superconductor layer comprises a material selected from the group consisting of $REBa_2Cu_3O_{7-x}$, where RE is one of more elements selected from the group consisting of Y, Gd, Sm, Nd, Eu, Dy, Ho, Yb, Er, Tm, and Lu, and wherein $0 \leq x \leq 1$.

14. The superconductor tape of claim 10, wherein the buffer layer comprises a material selected from the group consisting of MgO, $LaMnO_3$, $CeO_2$, $Gd_2Zr_2O_7$, YSZ, $SrTiO_3$, and combinations thereof.

15. The superconductor tape of claim 10, wherein the substrate comprises a metal selected from the group consisting of Hastelloy, Stainless Steel, Ni-W, Inconel, metallic glasses, and combinations thereof.

16. The superconductor tape of claim 10, further comprising a conductive layer overlying the overlayer.

17. The superconductor tape of claim 16, wherein the conductive layer comprises copper (Cu) or at least one Cu alloy or a conductive metal alloy.

18. The superconductor tape of claim 16, further comprising a second overlayer and a second conductive layer, wherein the substrate is positioned between the buffer layer and the second overlayer, and the second overlayer is positioned between the substrate and the second conductive layer.

* * * * *